United States Patent
Mirzoyan et al.

(10) Patent No.: US 12,295,180 B2
(45) Date of Patent: May 6, 2025

(54) SEMICONDUCTOR PHOTOMULTIPLIER MODULE COMPRISING A STACKED CONFIGURATION OF A SENSOR CHIP AND ELECTRONIC READOUT CHIPS

(71) Applicant: Max-Planck-Gesellschaft zur Förderung der Wissenschaften e.V., Munich (DE)

(72) Inventors: Razmik Mirzoyan, Unterschleißheim (DE); Masahiro Teshima, Unterschleißheim (DE); David Gascon Fora, Barcelona (ES); Andreu Sanuy Charles, Barcelona (ES); Sergio Gomez Fernandez, Barcelona (ES)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 510 days.

(21) Appl. No.: 17/794,719

(22) PCT Filed: Jan. 22, 2021

(86) PCT No.: PCT/EP2021/051448
§ 371 (c)(1),
(2) Date: Jul. 22, 2022

(87) PCT Pub. No.: WO2021/148603
PCT Pub. Date: Jul. 29, 2021

(65) Prior Publication Data
US 2023/0084348 A1    Mar. 16, 2023

(30) Foreign Application Priority Data

Jan. 22, 2020  (EP) .................................. 20153057

(51) Int. Cl.
*H01L 27/146* (2006.01)
*H04N 25/78* (2023.01)
(Continued)

(52) U.S. Cl.
CPC ........... *H10F 39/809* (2025.01); *H04N 25/78* (2023.01); *H04N 25/79* (2023.01); *H10F 39/018* (2025.01)

(58) Field of Classification Search
CPC .... H10F 39/809; H10F 39/018; H10F 10/161; H10F 10/164; H10F 39/80; H10F 77/703;
(Continued)

(56) References Cited

U.S. PATENT DOCUMENTS 8,446,503 B1 *  5/2013  Koenck .................... H04N 5/33
                                                            348/297
2004/0229398 A1   11/2004  Magerlein et al.
(Continued)

FOREIGN PATENT DOCUMENTS

CN         209804170 U  * 12/2019

OTHER PUBLICATIONS

International Search Report and Written Opinion cited in PCT/EP2021/051448, mailed Mar. 24, 2021, 16 pages.

*Primary Examiner* — Niki H Nguyen
(74) *Attorney, Agent, or Firm* — Cooper Legal Group, LLC

(57) ABSTRACT

A semiconductor photomultiplier module (20; 30; 40) comprises a first semiconductor chip (21; 31; 41) disposed in a first plane and comprising an array (21.1) of single-photon avalanche diodes (SPAD), a second semiconductor chip (22; 32; 42) disposed in a second plane and comprising a first part of an electronic read-out circuit, and a third semiconductor chip (26; 36; 46) comprising a second part of the electronic read-out circuit, wherein the first semiconductor chip (21;
(Continued)

31; 41) and the second semiconductor chip (22; 32; 42) are arranged in a stacked relationship and vertical electrical interconnects (23) are arranged to electrically interconnect the first semiconductor chip (21; 31; 41) with the second semiconductor chip (22; 32; 42).

18 Claims, 8 Drawing Sheets

(51) Int. Cl.
*H04N 25/79* (2023.01)
*H10F 39/00* (2025.01)

(58) Field of Classification Search
CPC ...... H10F 39/18; H10F 30/225; H10F 10/165; H10F 19/804; H10F 19/807; H04N 25/78; H04N 25/79; G02B 27/0012; F16B 5/0642

See application file for complete search history.

(56) References Cited

U.S. PATENT DOCUMENTS

| | | |
|---|---|---|
| 2012/0133001 A1 | 5/2012 | Tkaczyk et al. |
| 2015/0115131 A1 | 4/2015 | Webster et al. |
| 2015/0200222 A1 | 7/2015 | Webster |

* cited by examiner

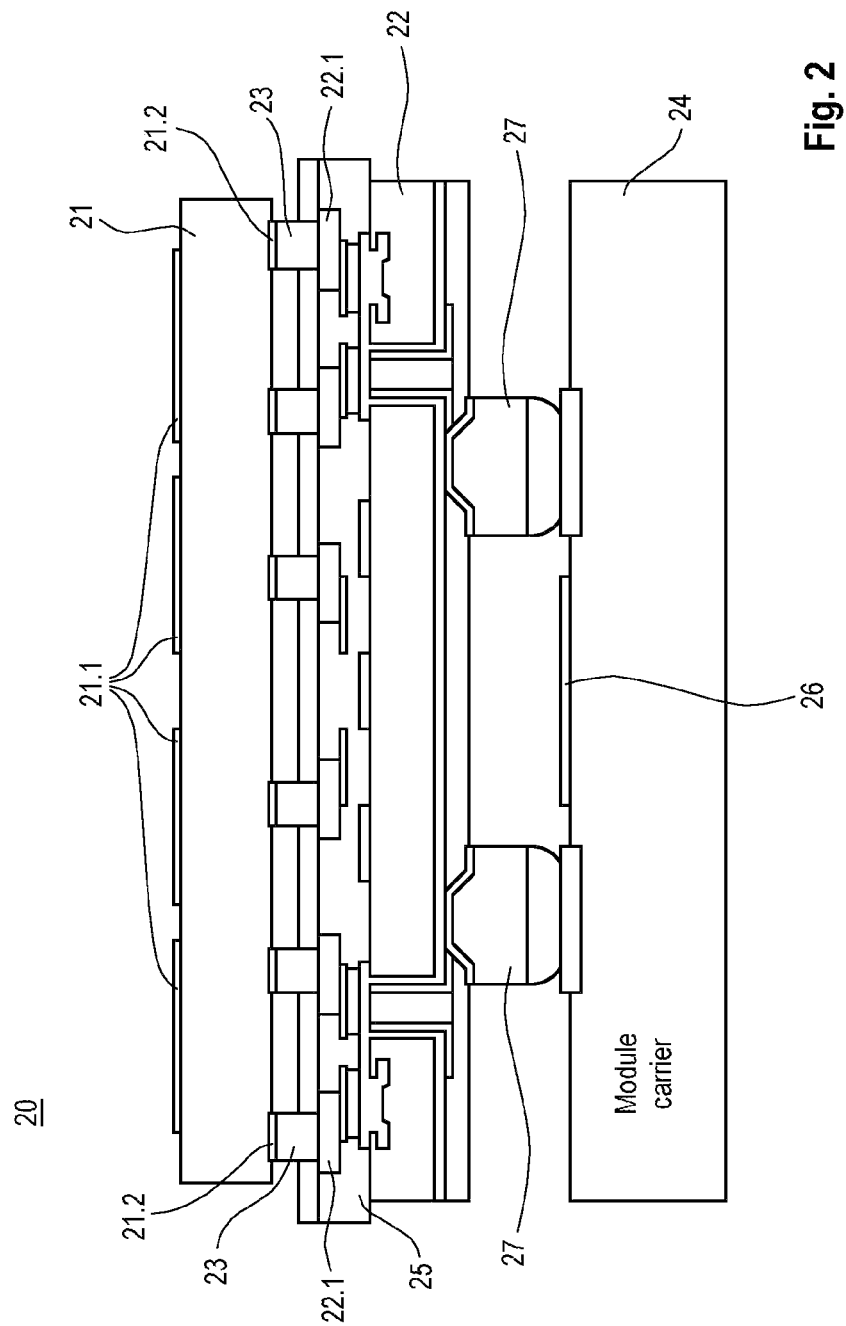

| | Sqrt of sensor area (mm) | SPAD size (μm) | Sensor cells (# SPAD) | Group size = k (# SPAD) | TSV/PAD pitch (mm) | Number of SPAD groups (n) | Analog Summation Outputs (p) | Effective pixel size (mm) |
|---|---|---|---|---|---|---|---|---|
| High spatial resolution | 3 | 50 | 3600 | 36 | 0.3 | 100 | 100 | 0.3 |
| Low power & high rate | 3 | 50 | 3600 | 36 | 0.3 | 100 | 1 | 3 |

Fig. 8

SEMICONDUCTOR PHOTOMULTIPLIER MODULE COMPRISING A STACKED CONFIGURATION OF A SENSOR CHIP AND ELECTRONIC READOUT CHIPS

TECHNICAL FIELD

The present disclosure relates in general to the field of semiconductor optoelectronic devices, in particular to photo-detectors with high efficiency of light detection, including the visible part of the spectrum. Photo-detectors according to the disclosure, namely silicon photoelectric multipliers, can be used in a wide field of applications, which employ the detection of very weak and fast optical signals.

The present disclosure relates in particular to a semiconductor photomultiplier module which comprises a stacked configuration of a first semiconductor chip, which acts as a sensor chip, a second semiconductor chip which comprises a first electronic read-out circuit, and a third semiconductor chip which comprises a second electronic read-out circuit, wherein the first, second, and third semiconductor chips are disposed in three different planes. The present disclosure further relates to an array of silicon photoelectric modules which are laterally connected with each other. The present disclosure further relates to a method for fabricating a silicon photoelectric module.

BACKGROUND

Silicon photoelectric multipliers have developed over the past decades to highly efficient detectors for low light level optical signals from different emission sources. Therefore silicon photoelectric multipliers have become attractive for many different applications as, for example, industrial and medical tomography, life science, nuclear, particle and astroparticle physics, etc. However, it is still the case up to now that the various users of silicon photomultipliers follow their respective own paths to the manufacture of appropriate detectors and this relates to the fabrication of the sensors as well as to the read-out electronics. There is still lacking a universal concept of building up areas of silicon photoelectric multipliers of different size.

SUMMARY

A first aspect of the present disclosure is related to a semiconductor photomultiplier module, comprising a first semiconductor chip disposed in a first plane and comprising an array of single-photon sensors, a second semiconductor chip disposed in a second plane and comprising a first part of an electronic read-out circuit, and a third semiconductor chip comprising a second part of the electronic read-out circuit, wherein the first semiconductor chip and the second semiconductor chip are arranged in a stacked relationship and vertical electrical interconnects are arranged to electrically interconnect the first semiconductor chip with the second semiconductor chip, and further comprising a module carrier wherein the third semiconductor chip is connected with the module carrier, wherein the module carrier is one of a printed circuit board or a ceramic substrate, and further comprising a waveform digitizer connected with an output of the first part of the electronic read-out circuit and with an input of the second part of the electronic read-out circuit, wherein the waveform digitizer is part of or integrated in the second semiconductor chip (22; 32; 42), or part of or integrated in the third semiconductor chip (26; 36; 46).

A second aspect of the present disclosure is related to an array of semiconductor photomultiplier modules, wherein a plurality of semiconductor photomultiplier modules according to the first aspect are laterally connected with each other with zero dead space between them.

A third aspect of the present disclosure is related to a method for fabricating a semiconductor photomultiplier module, the method comprising providing a first semiconductor chip comprising an array of single-photon sensors, providing a second semiconductor chip comprising a first part of an electronic read-out circuit, providing a third semiconductor chip comprising a second part of the electronic read-out circuit, arranging the first and second semiconductor chips in a stacked relationship, and providing vertical electrical interconnects to electrically interconnect the first and second semiconductor chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIG. 2 shows a schematic cross-sectional representation of an example of a semiconductor photomultiplier module according to the first aspect.

FIG. 8 shows a table listing characteristic parameter values of the electronic circuits of FIGS. 5 and 6 when changing effectively the granularity (or pixelation or pixelization) of the sensor.

DETAILED DESCRIPTION OF THE DISCLOSURE

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the abovementioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

Figure 1:
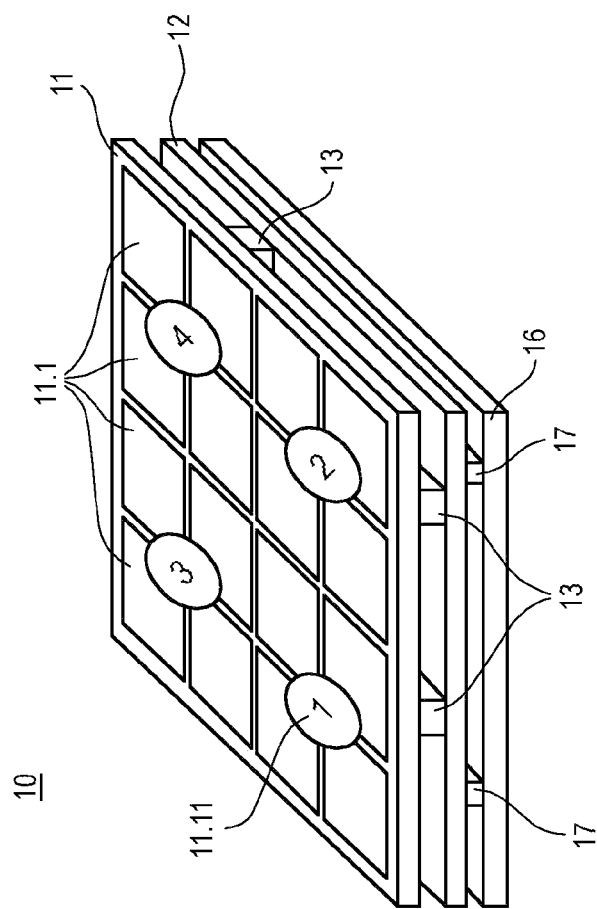
FIG. 1 shows a schematic perspective view onto a semiconductor photomultiplier module according to an example.

FIG. 1 shows a schematic perspective view onto a semiconductor photomultiplier module according to an example.

The semiconductor photomultiplier module 10 of FIG. 1 comprises a first semiconductor chip 11 disposed in a first plane (or tier) and comprising an array 11.1 of single-photon avalanche diodes (SPAD) as an example of single-photon sensors, a second semiconductor chip 12 disposed in a second plane and comprising a first part of an electronic read-out circuit, and a third semiconductor chip 16 disposed in a third plane and comprising a second part of the electronic read-out circuit, wherein the first, second, and third semiconductor chips 11, 12, and 16 are arranged in a stacked relationship and vertical electrical interconnects 13 and 17 are arranged to electrically interconnect the first and second semiconductor chips 11 and 12, and the second and third semiconductor chips 12 and 16, respectively. The combination of the first and second semiconductor chips 11 and 12 is often called "hybrid".

FIG. 2 shows a schematic cross-sectional representation of a semiconductor photomultiplier module according to the first aspect. The representation as shown in FIG. 2 is still rather schematic, but reveals some more technical details of a practical implementation which will be explained below.

Similar to the embodiment of FIG. 1, the semiconductor photomultiplier module 20 of FIG. 2 comprises a first semiconductor chip 21 disposed in a first plane (or tier) and comprising an array 21.1 of single-photon avalanche diodes (SPAD), a second semiconductor chip 22 disposed in a second plane and comprising a first part of an electronic read-out circuit, and a third semiconductor chip 26 disposed in a third plane and comprising a second part of the electronic read-out circuit, wherein the first, second, and third semiconductor chips 21, 22, and 26 are arranged in a stacked relationship and vertical electrical interconnects 23 and 27 are arranged to electrically interconnect the first and second semiconductor chips 21 and 22, and the second 22 and third 26 semiconductor chips, respectively.

According to an example of the semiconductor photomultiplier module 10 or 20, the first part of the electronic read-out circuit disposed on the second semiconductor chip 12 or 22 comprises an application-specific integrated circuit (ASIC) wherein an input of the ASIC is connected with an output of the SPAD array 11.1 or 21.1. As will be explained in more detail below, the ASIC can be configured so that the effective read-out pixel size of the SPADs can be dynamically changed.

According to an example of the semiconductor photomultiplier module 10 or 20, the second part of the electronic read-out circuit disposed on the third semiconductor chip 16 or 26 comprises an electronic digital circuit, in particular one or more of an ASIC, a programmable logic device (PLD), field-programmable gate array (FPGA), a programmable array logic (PAL), or a complex programmable logic device (CPLD), wherein the electronic digital circuit may be configured as a digital signal processor (DSP). An output of the ASIC can then be connected with an input of the electronic digital circuit and an output of the electronic digital circuit is connected with an input of the ASIC.

According to an example of the semiconductor photomultiplier module 10 or 20, the third semiconductor chip 16 or 26 further comprises one or more interface units in order to provide, for example, interfaces to the Ethernet or to any kind of optical links. The interface units can be configured to provide a scalable data interface or a fast synchronization interface. Alternatively, such interface units are not disposed on the third semiconductor chip 16 or 26, but instead on an additional carrier which is interposed between the second and third semiconductor chips 12 or 22 and 16 or 26.

According to an example of the semiconductor photomultiplier module 20, the semiconductor photomultiplier module 20 further comprises a module carrier 24 wherein the third semiconductor chip 26 is disposed on the module carrier 24. The module carrier 24 can be any kind of substrate which easily allows to form therein electric traces to the third semiconductor chip 26, hence a module carrier like, for example, a printed circuit board (PCB), or a ceramic substrate.

According to an example of the semiconductor photomultiplier module of the first aspect, the semiconductor photomultiplier module further comprises a (high-speed) waveform digitizer. In this case an output of the ASIC can be connected with an input of the waveform digitizer and an output of the waveform digitizer can be connected with an input of the electronic digital circuit. This waveform digitizer can be either part of the second part of the electronic read-out circuit and be integrated in the third semiconductor chip. Alternatively, the waveform digitizer can also be part of the first part of the electronic read-out circuit and be integrated in the second semiconductor chip. It is also possible to integrate the waveform digitizer in the module carrier 24.

The semiconductor photomultiplier module of the first aspect so far, can have the form of a 3D integrated system-in-package (SiP), in which the first and second semiconductor chips of the SiP are stacked vertically over a common module carrier. Moreover each SiP comprises a sensor and a complete read-out circuit so that no further external readout circuit is necessary. Within the SiP the semiconductor chips disposed in adjacent planes are connected with standard vertical electrical interconnects as will be described further below in even more detail.

According to an Example of the semiconductor photomultiplier module of the first aspect, the module is intended to be connected to other similar or identical modules in order to fabricate an array of a plurality of semiconductor photomultiplier modules, in particular an array according to the second aspect. In particular, the modules may be fabricated in such a manner that they could be connected with each other in a side-by-side manner. To this end, particular fastening elements like, for example, mechanical fastening elements like hooks, clamps, or chemical fastening elements like, for example, adhesives could be provided on some or more of the side surfaces of the module.

According to an example of the semiconductor photomultiplier module 10 or 20, an area of the semiconductor photomultiplier module 10 or 20 is in a range from 0.1 to 10 $cm^2$, wherein the lower bound of the range can also be 0.5, 1, 2, 3, 4, or 5 $cm^2$, and the upper bound of the range can also be 9, 8, 7, 6, or 5 $cm^2$.

According to an example of the semiconductor photomultiplier module 10 or 20, a shape of the module can be rectangular, in particular square, or hexagonal, or any other polygonal shape, in particular such that module can be tiled with virtual dead space between them.

According to an example of the semiconductor photomultiplier module 20, the first semiconductor chip 21 comprises a number of first electrical contact pads 21.2, and the second semiconductor chip 22 comprises an equal number of second electrical contact pads 22.1, wherein the vertical electrical interconnects 23 connect the first 21.2 and second 22.1 electrical contact pads. According to a further example thereof, the vertical electrical interconnects 23 are formed by forming through-silicon vias (TSVs) in the first semiconductor chip 21 and forming solder bumps onto the TSVs, and connecting the first semiconductor chip to the second semiconductor chip by connecting the solder bumps to the second electrical contact pads of the second semiconductor chip.

According to a further example of the semiconductor photomultiplier module 20, the semiconductor photomultiplier module 20 further comprises an interposer layer 25 disposed between the first and second semiconductor chips 21 and 22. According to a further example thereof, the interposer layer 25 comprises an electrical redistribution layer. As can be seen in FIG. 2, there may be a lateral displacement between the vertical interconnects 23 and electrical contact pads of the second semiconductor chip 22 on an upper surface thereof. The electrical redistribution layer serves the purpose to electrically connect each ones of the vertical interconnects 23 with an electrical contact pad on the upper surface of the second semiconductor chip 22.

According to an example of the semiconductor photomultiplier module of the first aspect, the SPAD array 11.1 is divided into a number of SPAD groups 11.11 wherein each one of the SPAD groups 11.11 is connected individually with the first part of the electronic read-out circuit disposed on the second semiconductor chip 12 or 22, in particular the ASIC. According to a further example thereof, the ASIC is segmented into a plurality of ASIC portions wherein each one of the ASIC portions is connected with one of the SPAD groups 11.11. According to a further example thereof, the ASIC is configured so that the area of the SPAD groups 11.11 can be dynamically changed. This will be explained in further detail below.

Figure 3A:
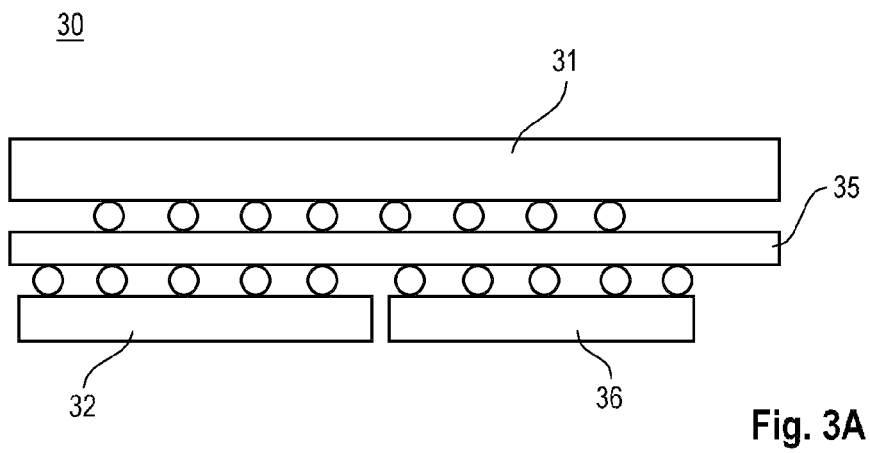
FIG. 3 comprises FIGS. 3A and 3B and shows schematic cross-sectional representations of further examples of semiconductor photomultiplier modules according to the first aspect, both of which comprising a PCB interposer.
Figure 3B:
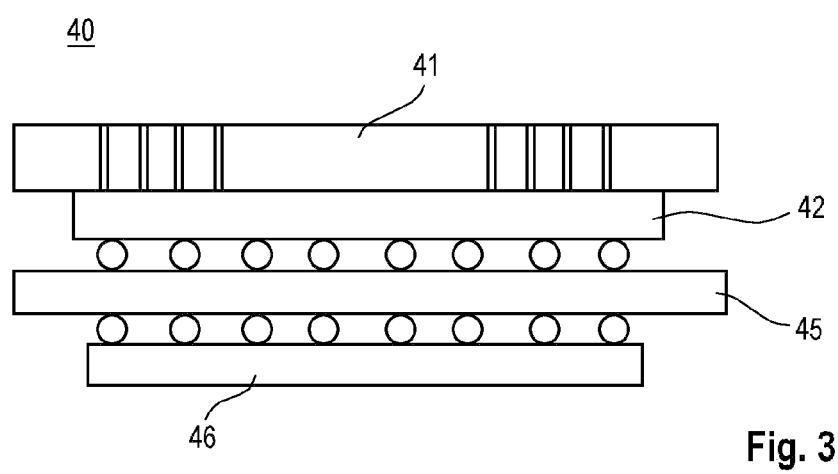

FIG. 3 comprises FIGS. 3A and 3B and shows schematic cross-sectional representations of further examples of semiconductor photomultiplier modules, both of which comprising a PCB interposer.

FIG. 3A shows a semiconductor photomultiplier module 30 comprising a first semiconductor chip 31 disposed in a first plane and comprising an array of single-photon sensors, a second semiconductor chip 32 comprising a first part of an electronic read-out circuit, and a third semiconductor chip 36 comprising a second part of the electronic read-out circuit, both the second and third semiconductor chips 32 and 36 being disposed in a second plane wherein the first semiconductor chip 31 and the second and third semiconductor chips 32 and 36 are arranged in a stacked relationship. Between the first and second planes a PCB interposer 35 is arranged so that the first semiconductor chip 31 is connected by vertical interconnects like package balls to contact areas on an upper surface of the PCB interposer 35, and the second and third semiconductor chips 32 and 36 are connected by vertical interconnects like package balls to contact areas on a lower surface of the PCB interposer 35. The first semiconductor chip 31 is thus connected by vertical interconnects with the second and third semiconductor chips 32 and 36, the vertical interconnects being comprised of the package balls and inner vertical interconnects of the PCB interposer 35. The first, second and third semiconductor chips 31, 32 and 35 can have the same properties as the first, second and third semiconductor chips of previous examples as were described in connection with FIGS. 1 and 2.

FIG. 3B shows a semiconductor photomultiplier module 40 comprising a first semiconductor chip 41 disposed in a first plane and comprising an array of single-photon sensors, a second semiconductor chip 42 disposed in a second plane and comprising a first part of an electronic read-out circuit, and a third semiconductor chip 46 disposed in a third plane and comprising a second part of the electronic read-out circuit, wherein the first semiconductor chip 41 and the second semiconductor chip 42 are arranged in a stacked relationship and vertical electrical interconnects like package balls are arranged to electrically interconnect the first semiconductor chip 41 with the second semiconductor chip 42. Between the second and third planes and thus between the second and third semiconductor chips 42 and 46 a PCB interposer 45 is arranged so that the second semiconductor chip 42 is connected by vertical interconnects like package balls to contact areas on an upper surface of the PCB interposer 45, and the third semiconductor chip 46 is connected by vertical interconnects like package balls to contact areas on a lower surface of the PCB interposer 45. The first semiconductor chip 41 is thus connected by vertical interconnects with the second semiconductor chip 42, the vertical interconnects being essentially comprised of through silicon vias (TSVs) formed into the first semiconductor chip 41. The first, second and third semiconductor chips 41, 42 and 46 can have the same properties as the first, second and third semiconductor chips of previous examples as were described in connection with FIGS. 1 and 2.

It should be added that all features and embodiments described above for the semiconductor photomultiplier modules 10 and 20 can also be used with the semiconductor photomultiplier modules 30 and 40 of FIGS. 3A and 3B.

Figure 4:
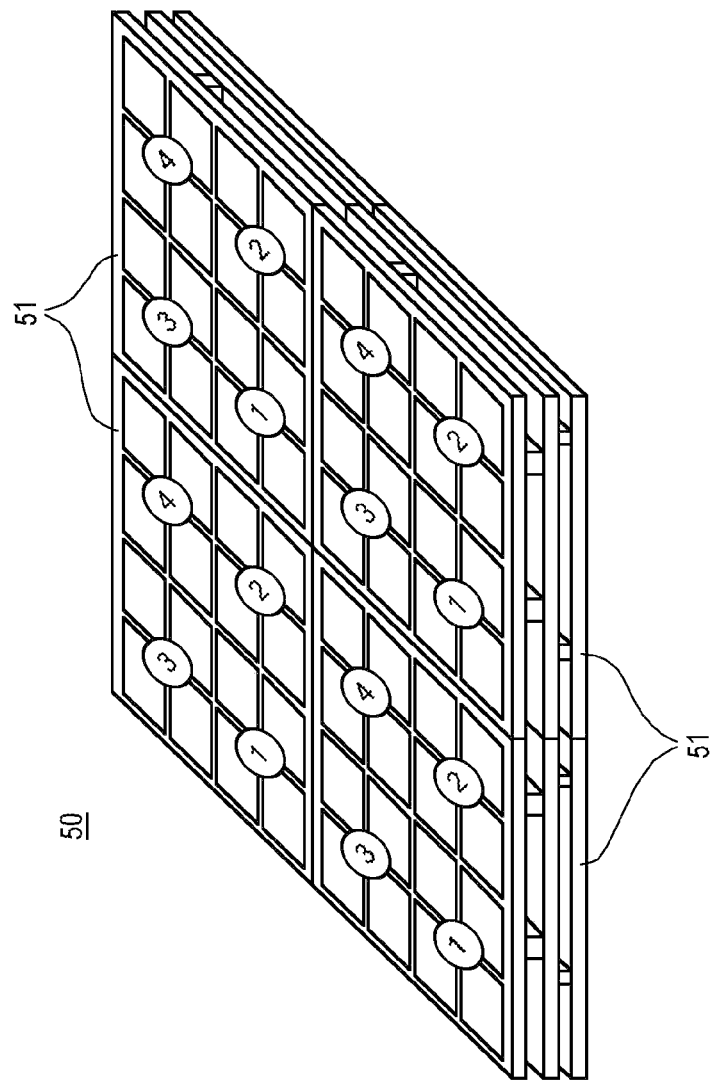
FIG. 4 shows a schematic perspective view of an array of a plurality of semiconductor photomultiplier modules according to the second aspect, the semiconductor photomultiplier modules laterally connected with each other.

FIG. 4 shows a schematic perspective view of an array of a plurality of semiconductor photomultiplier modules according to the second aspect, the semiconductor photomultiplier modules being laterally connected with each other. The semiconductor photomultiplier modules can be provided according to the first aspect and in particular according to one of the examples as described above.

The array 50 as shown in FIG. 4 comprises a plurality of semiconductor photomultiplier modules 51 such were shown and described in FIG. 1. It can be seen that the semiconductor photomultiplier modules 51 are laterally connected with each other with virtually zero dead space between them. In such a way arrays of any desired size and any desired shape can be assembled, entirely in the manner of a mosaic. The array 50 as shown in FIG. 4 has a planar shape. However, it is also possible that the array may also have a curved shape, for example by using flexible or semi-rigid modular carriers.

It should be added that similar arrays can be fabricated by tiling semiconductor photomultiplier modules 20, 30, or 40 as were shown and described in connection with FIGS. 2 and 3.

According to an example of the array of the second aspect, the semiconductor photomultiplier modules are individual and/or pre-fabricated and/or independently manageable.

According to an example of the array of the second aspect, the semiconductor photomultiplier modules are laterally connected with each other by means of particular fastening elements like, for example, mechanical fastening elements like hooks, clamps, or chemical fastening elements like, for example, adhesives.

According to an example of the array of FIG. 4, the array 50 can have an area in a range from 0.00004 $m^2$ to 10 $m^2$, wherein the lower bound of the range can also be 0.001, 0.005, 0.01, 0.05, 0.1, 0.5, or 1 $m^2$, and the upper bound can also be 9, 8, 7, 6, 5, 4, 3, 2, or 1 $m^2$. The smallest possible size of the array of 0.00004 $m^2$ results from using the smallest possible area of the module of 0.00001 $m^2$ and forming an array of 4 modules such as that shown in FIG. 3.

Figure 5:
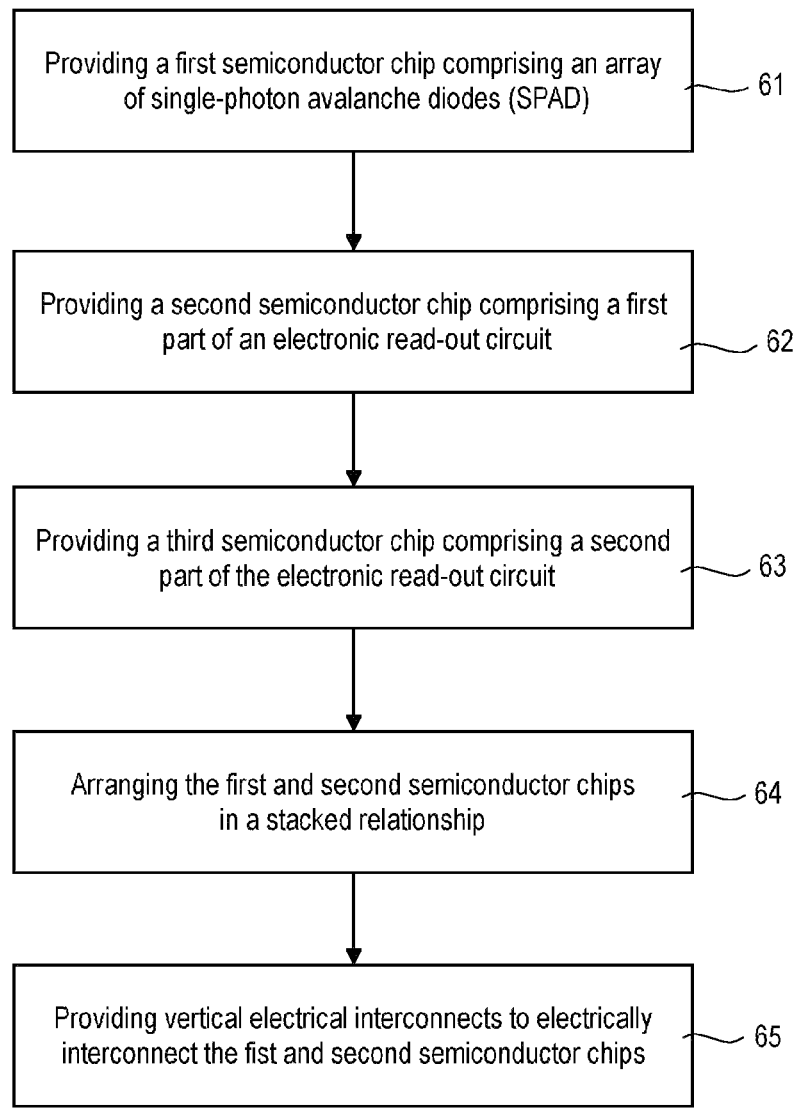
FIG. 5 shows a flow diagram of a method for fabricating a semiconductor photomultiplier module according to the third aspect.

FIG. 5 shows a flow diagram of a method for fabricating a semiconductor photomultiplier module according to the third aspect.

A method (60) for fabricating a semiconductor photomultiplier module according to FIG. 5 comprises providing a first semiconductor chip comprising an array of single-photon avalanche diodes (SPAD) as an example of single-photon sensors (61), providing a second semiconductor chip comprising a first part of an electronic read-out circuit (62), providing a third semiconductor chip comprising a second part of the electronic read-out circuit (63), arranging the first and second semiconductor chips in a stacked relationship (64), and providing vertical electrical interconnects to electrically interconnect the first and second semiconductor chips (65).

According to an example of the method 60 of FIG. 5, the method 60 further comprises providing a module carrier and connecting the third semiconductor chip with the module carrier.

According to an example of the method 60 of FIG. 5, the first semiconductor chip comprises a number of first electrical contact pads, and the second semiconductor chip comprises an equal number of second electrical contact pads, the method further comprising forming the vertical electrical interconnects between the first and second electrical contact pads.

According to an example of the method 60 of FIG. 5, the method 60 further comprises providing the third semiconductor chip in a third plane, and forming vertical electrical interconnects also between the second semiconductor chip and the third semiconductor chip.

According to an example of the method 60 of FIG. 5, the method 60 further comprises forming the vertical electrical interconnects through-silicon vias (TSVs) in the first semiconductor chip and forming solder bumps onto the TSVs, and connecting the first semiconductor chip to the second semiconductor chip by connecting the solder bumps to the second electrical contact pads of the second semiconductor chip.

According to an example of the method 60 of FIG. 5, the method 60 further comprises disposing an interposer layer between the first and second semiconductor chips and forming a redistribution layer in the interposer layer such that the redistribution layer electrically connects each one of the vertical interconnects with an electrical contact pad on an upper surface of the second semiconductor chip.

Figure 6:
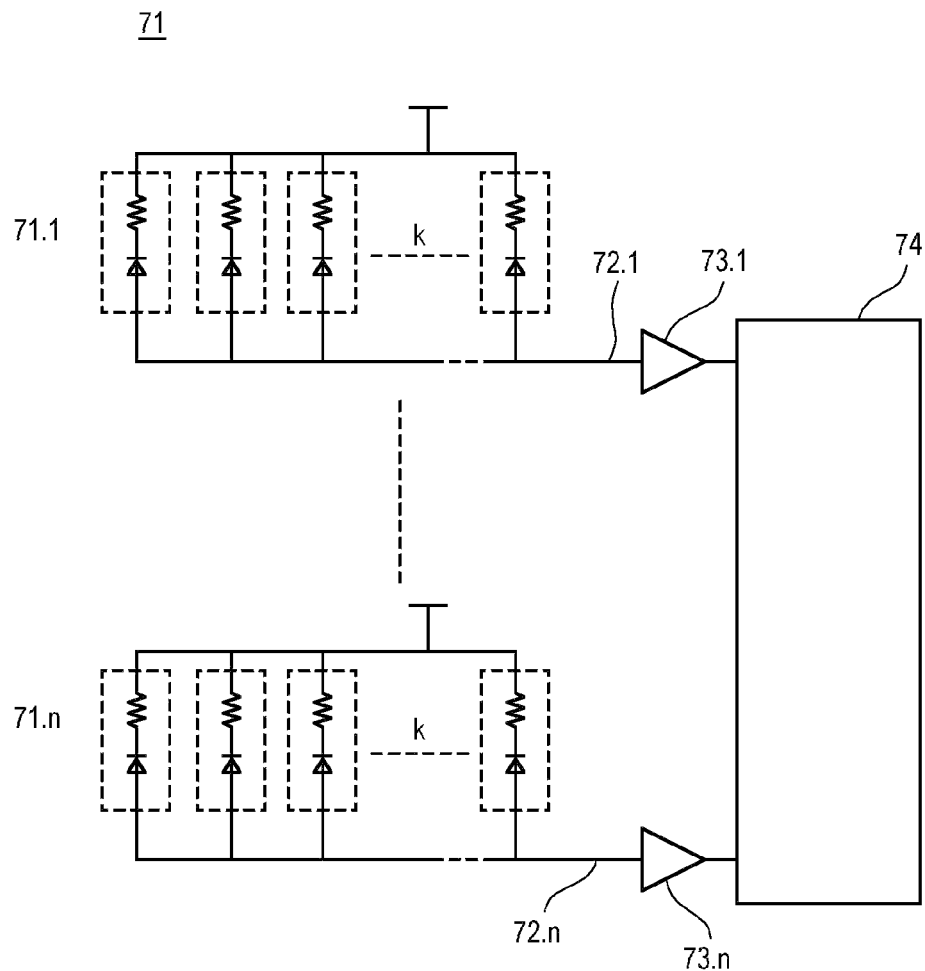
FIG. 6 shows a diagram of an electronic circuit comprising a SPAD array of a semiconductor photomultiplier module subdivided in SPAD groups which are readout by a signal processing unit.

FIG. 6 shows an electronic circuit diagram for illustrating how a semiconductor photomultiplier module is subdivided in small SPAD groups.

It has already been shown in FIG. 1 that the SPAD array can be divided into a number of SPAD groups. In FIG. 6 the SPAD array and the SPAD groups are designated with reference signs 71 and 71.1 to 71.$n$, respectively. The SPAD array 71 includes a number of n SPAD groups and each SPAD group includes a number of k individual SPADs each of which is depicted as being surrounded by a dashed frame. Each SPAD includes a series connection between a sensor element and a quenching resistor and is connected on one side with a voltage source and on the other side with an output line. The SPADS of one SPAD group 71.1 to 71.$n$ are all connected with a common output line. The n output lines 72.1 to 72.$n$ are connected with n input stages 73.1 to 73.$n$, respectively, and the n input stages 73.1 to 73.$n$ are connected to a signal processing unit 74.

It has been shown in FIG. 2 for the semiconductor photomultiplier module 20, that the first semiconductor chip 21 is connected with the second semiconductor chip 22 by a plurality of vertical electrical interconnects 23. These vertical electrical interconnects 23 correspond to the n output lines 72.1 to 72.$n$ as shown in FIG. 6. In the signal processing unit 74 the n processing channels can be reduced in the processing chain to a lesser number meaning an effective read-out of a lesser number of SPADS groups. Two examples thereof will be explained further below.

Figure 7:
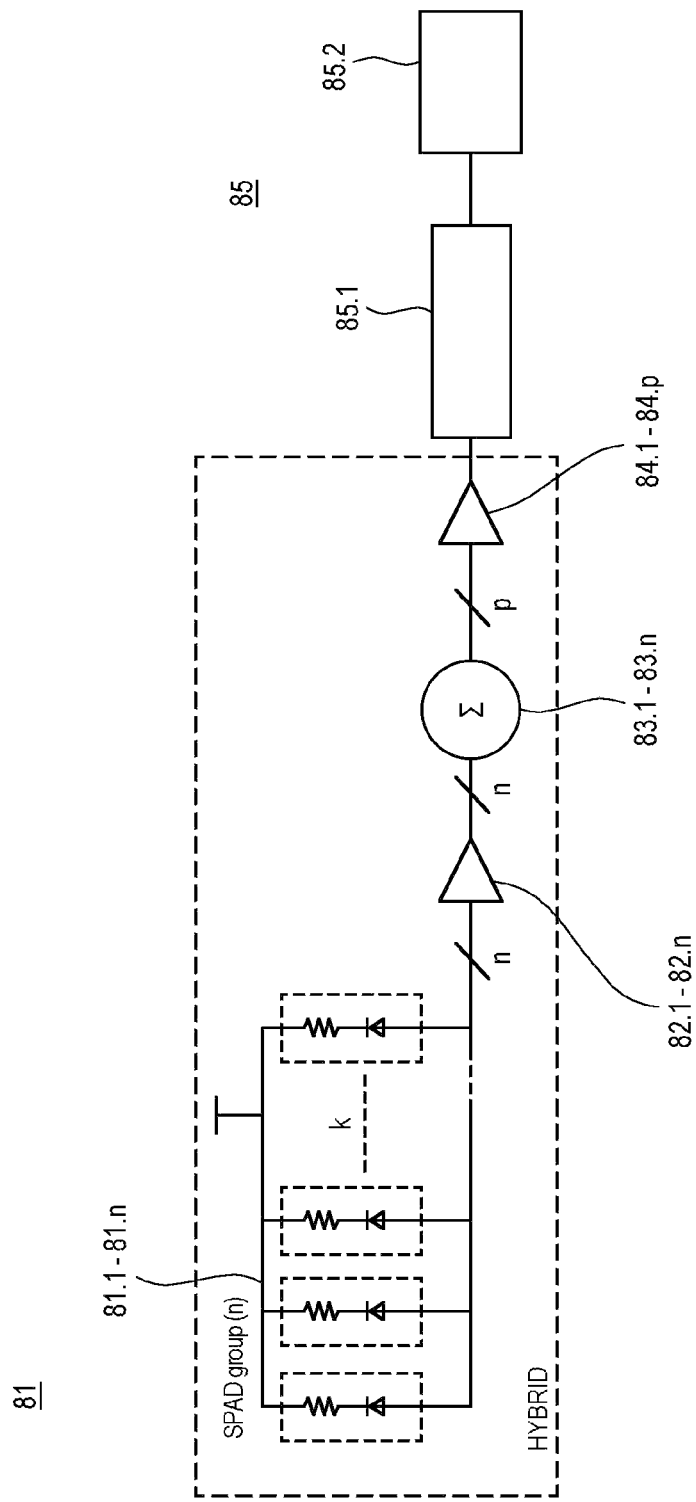
FIG. 7 shows a diagram of an electronic circuit which depicts an example of the electronic circuit diagram of FIG. 6.

FIG. 7 shows an electronic circuit diagram which depicts an example of the electronic circuit diagram of FIG. 6.

The circuit diagram of FIG. 7 shows within the dashed frame a hybrid, i.e. a SPAD array 81 and further electronic devices being part of an ASIC. The n SPAD groups 81.1 to 81.$n$ of the SPAD array 81 are depicted in a somewhat different representation as compared to FIG. 6. The ASIC includes in this embodiment n input stages 82.1 to 82.$n$, n fast analog summation units 83.1 to 83.$n$, and p output buffers 84.1 to 84.$p$. That means, n is the number of SPAD groups per SPAD array, k is the number of elements of each SPAD group, and p is the number of fast analog summation outputs, wherein the fast analog summation units 83.1 to 83.$n$ can be programmed to combine two or more of the SPAD groups together to end up with a reduced number of channels p≤n. As an example, the area of the SPAD array may be 3×3 mm², each SPAD has a size of 50 µm×50 µm, so that there are 36 (n) SPAD groups each having 100 (k) SPADs. With the circuit as shown in FIG. 7, the number of channels can be reduced down to any number between 1 and 36 depending on the number of channels of the waveform digitizer 85.1.

The circuit diagram of FIG. 7 further shows the electronic digital circuit 85, which is disposed on the third semiconductor chip in the third plane as was explained in connection with FIGS. 1 and 2. In this embodiment the electronic digital circuit 85 comprises the waveform digitizer circuit 85.1 and a digital signal processor (DSP) 85.2 which can be built up by, for example, a field-programmable gate array (FPGA). Also other circuits are possible at this place as, for example a programmable logic device (PLD), a programmable array logic (PAL), or a complex programmable logic device (CPLD).

FIG. 8 shows a table listing characteristic parameter values of the electronic circuits of FIGS. 6 and 7 when changing the effective granularity (effective pixel size) of the sensor.

The effective hybrid pixel size is configurable from 0.3 mm to 3 mm. The first and second lines of this table represent these two bounds. The first line corresponds to the highest possible spatial resolution in which the number of pads or channels n=36 equals the number p of digitized channels. So in this case no change in the number of channel and in the effective hybrid pixel size is done, and the spatial resolution is 0.3 mm. The second line corresponds to the lowest possible spatial effective resolution in which the number of pads or channels n=36 is reduced to a number p=1 of channels at the output of the hybrid. So in this case the effective hybrid pixel size is enlarged to the whole SPAD array so that the spatial resolution is 3 mm.

EXAMPLES

In the following, a semiconductor photomultiplier module, an array of semiconductor photomultiplier modules, and a method for fabricating a semiconductor photomultiplier module according to the present disclosure will be explained by means of further examples. Each one of these examples or details thereof can be combined with any features or examples described above.

Example 1 is a semiconductor photomultiplier module, comprising a first semiconductor chip disposed in a first plane and comprising an array of single-photon sensors, a second semiconductor chip disposed in a second plane and comprising a first part of an electronic read-out circuit, and a third semiconductor chip disposed in a third plane and comprising a second part of the electronic read-out circuit, wherein the first, second, and third semiconductor chips are arranged in a stacked relationship and vertical electrical interconnects are arranged to electrically interconnect the first and second semiconductor chips, and the second and third semiconductor chips.

Example 2 is the semiconductor photomultiplier module according to Example 1, wherein the first part of the electronic read-out circuit comprises an application-specific integrated circuit (ASIC) wherein an input of the ASIC is connected with an output of the array.

Example 3 is the semiconductor photomultiplier module (10; 20) according to Example 1 or 2, wherein the second part of the electronic read-out circuit comprises an electronic digital circuit, in particular one or more of a programmable logic device (PLD), field-programmable gate array (FPGA), a programmable array logic (PAL), or a complex programmable logic device (CPLD).

Example 4 is the semiconductor photomultiplier module according to Examples 2 and 3, wherein an output of the ASIC is connected with an input of the electronic digital circuit and an output of the electronic digital circuit is connected with an input of the ASIC.

Example 5 is the semiconductor photomultiplier module according to any one of the preceding Examples, further comprising a module carrier wherein the third semiconductor chip is disposed on the module carrier.

Example 6 is the semiconductor photomultiplier module according to any one of the preceding Examples, further comprising a waveform digitizer connected with an output of the first part of the electronic read-out circuit and with an input of the second part of the electronic read-out circuit, wherein the waveform digitizer is part of or integrated in the second semiconductor chip, or part of or integrated in the third semiconductor chip.

Example 7 is the semiconductor photomultiplier module according to any one of the preceding Examples, wherein the first semiconductor chip comprises a number of first electrical contact pads, and the second semiconductor chip comprises an equal number of second electrical contact pads, wherein the vertical electrical interconnects connect the first and second electrical contact pads.

Example 8 is the semiconductor photomultiplier module according to Example 7, wherein the vertical electrical interconnects are formed by through-silicon vias (TSVs) formed in the first semiconductor chip and solder bumps connected to the TSVs.

Example 9 is the semiconductor photomultiplier module according to any one of the preceding Examples, further comprising an interposer layer disposed between the first and second semiconductor chips, wherein the interposer layer comprises an electrical redistribution layer.

Example 10 is the semiconductor photomultiplier module according to Example 2 and Examples 3 to 9 as related back to Example 2, wherein the array is divided into a number of groups wherein each one of the groups is connected with the ASIC.

Example 11 is the semiconductor photomultiplier module according to Example 10, wherein the ASIC is segmented into a plurality of ASIC portions wherein each one of the ASIC portions is connected with one of the groups.

Example 12 is the semiconductor photomultiplier module according to Example 10 or 11, wherein the ASIC is configured so that an area of the single-photon sensor groups can be dynamically changed.

Example 13 is the semiconductor photomultiplier module according to any one of the preceding claims, wherein an area of the module is in a range from 0.1 to 10 cm².

Example 14 is an array of semiconductor photomultiplier modules, wherein a plurality of semiconductor photomultiplier modules according to any one of the preceding Examples are laterally connected with each other with virtually zero dead space between them.

Example 15 is the array of semiconductor photomultiplier modules according to Example 14, wherein the array has a size in a range from 0.00004 m² to 10 m².

Example 16 is a method for fabricating a semiconductor photomultiplier module, the method comprising:
providing a first semiconductor chip comprising an array of single-photon sensors;
providing a second semiconductor chip comprising a first part of an electronic read-out circuit;

providing a third semiconductor chip comprising a second part of the electronic read-out circuit;
arranging the first, second, and third semiconductor chips in a stacked relationship; and
providing vertical electrical interconnects to electrically interconnect the first and second semiconductor chips, and the second and third semiconductor chips.

Example 17 is the method according to Example 16, further comprising providing a module carrier and connecting the third semiconductor chip with the module carrier.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. An individually pre-fabricated semiconductor photomultiplier module, comprising:
   a first semiconductor chip disposed in a first plane and comprising an array of single-photon sensors;
   a second semiconductor chip disposed in a second plane and comprising a first part of an electronic read-out circuit;
   a third semiconductor chip disposed in a third plane and comprising a second part of the electronic read-out circuit;
   wherein:
      the first semiconductor chip, the second semiconductor chip, and the third semiconductor chip are arranged in a stacked relationship and vertical electrical interconnects are arranged to electrically interconnect the first semiconductor chip and the second semiconductor chip, and the second semiconductor chip and the third semiconductor chip; and
   mechanical fastening elements configured to laterally connect the individually pre-fabricated semiconductor photomultiplier module with other individually pre-fabricated semiconductor photomultiplier modules.

2. The individually pre-fabricated semiconductor photomultiplier module according to claim 1, wherein:
   the first part of the electronic read-out circuit comprises an application-specific integrated circuit, and
   an input of the ASIC is connected with an output of the array.

3. The individually pre-fabricated semiconductor photomultiplier module according to claim 1, wherein:
   the second part of the electronic read-out circuit comprises an electronic digital circuit, and
   the electronic digital circuit comprises one or more of a programmable logic device, a field-programmable gate array, a programmable array logic, or a complex programmable logic device.

4. The individually pre-fabricated semiconductor photomultiplier module according to claim 3, wherein an output of the ASIC is connected with an input of the electronic digital circuit and an output of the electronic digital circuit is connected with an input of the ASIC.

5. The individually pre-fabricated semiconductor photomultiplier module according to claim 1, wherein:
   the first semiconductor chip comprises a number of first electrical contact pads, and
   the second semiconductor chip comprises an equal number of second electrical contact pads, and
   the vertical electrical interconnects connect the first electrical contact pads and the second electrical contact pads.

6. The individually pre-fabricated semiconductor photomultiplier module according to claim 5, wherein the vertical electrical interconnects are formed by through-silicon vias formed in the first semiconductor chip and solder bumps connected to the TSVs.

7. The individually pre-fabricated semiconductor photomultiplier module according to claim 1, further comprising:
   an interposer layer disposed between the first semiconductor chip and the second semiconductor chip, wherein the interposer layer comprises an electrical redistribution layer.

8. The individually pre-fabricated semiconductor photomultiplier module according to claim 2, wherein the array is divided into a number of n groups wherein each one of the n groups is connected with the ASIC.

9. The individually pre-fabricated semiconductor photomultiplier module according to claim 8, wherein:
   the ASIC is segmented into a plurality of ASIC portions, and
   each one of the ASIC portions is connected with one of the n groups.

10. The individually pre-fabricated semiconductor photomultiplier module according to claim 8, wherein the ASIC comprises n processing channels and is configured to reduce the n processing channels to a lesser number so that an area of the single-photon sensor groups is configured to be dynamically changed.

11. The individually pre-fabricated semiconductor photomultiplier module according to claim 1, wherein an area of the individually pre-fabricated semiconductor photomultiplier module is in a range from 0.1 to 10 $cm^2$.

12. An array of individually pre-fabricated semiconductor photomultiplier modules, wherein a plurality of individually pre-fabricated semiconductor photomultiplier modules according to claim 1 are laterally connected with each other with virtually zero dead space between the individually pre-fabricated semiconductor photomultiplier modules by means of the mechanical fastening elements.

13. The array of individually pre-fabricated semiconductor photomultiplier modules according to claim 12, wherein the array of individually pre-fabricated semiconductor photomultiplier modules has a size in a range from 0.00004 $m^2$ to 10 $m^2$.

14. A method for individually fabricating a semiconductor photomultiplier module, the method comprising:
  providing a first semiconductor chip comprising an array of single-photon sensors;
  providing a second semiconductor chip comprising a first part of an electronic read-out circuit;
  providing a third semiconductor chip comprising a second part of the electronic read-out circuit;
  arranging the first semiconductor chip, the second semiconductor chips, and the third semiconductor chip in a stacked relationship;
  providing vertical electrical interconnects to electrically interconnect the first semiconductor chip and the second semiconductor chips, and the second semiconductor chip and the third semiconductor chip; and
  providing mechanical fastening elements configured to laterally connect the semiconductor photomultiplier module with other individually pre-fabricated semiconductor photomultiplier modules.

15. The method according to claim 14, further comprising:
  providing a module carrier and connecting the third semiconductor chip with the module carrier.

16. The individually pre-fabricated semiconductor photomultiplier module according to claim 1, further comprising:
  a module carrier, wherein the third semiconductor chip is disposed on the module carrier.

17. The individually pre-fabricated semiconductor photomultiplier module according to claim 1, further comprising:
  a waveform digitizer connected with an output of the first part of the electronic read-out circuit and with an input of the second part of the electronic read-out circuit, wherein the waveform digitizer is part of or integrated in the second semiconductor chip, or part of or integrated in the third semiconductor chip.

18. A semiconductor photomultiplier module, comprising:
  a first semiconductor chip disposed in a first plane and comprising an array of single-photon sensors,
  a second semiconductor chip disposed in a second plane and comprising a first part of an electronic read-out circuit, and
  a third semiconductor chip disposed in a third plane and comprising a second part of the electronic read-out circuit,
  wherein:
    the first semiconductor chip, the second semiconductor chip, and the third semiconductor chip are arranged in a stacked relationship and vertical electrical interconnects are arranged to electrically interconnect the first semiconductor chip and the second semiconductor chip, and the second semiconductor chip and third semiconductor chip,
    the first part of the electronic read-out circuit comprises an application-specific integrated circuit (ASIC),
    an input of the ASIC is connected with an output of the array of single-photon sensors,
    the array comprises a number of n groups connected with the ASIC, and
    the ASIC comprises n processing channels and is configured to reduce the n processing channels to a lesser number so that an area of the single-photon sensor groups is configured to be dynamically changed.

* * * * *